(12) United States Patent
Grant et al.

(10) Patent No.: US 6,501,020 B2
(45) Date of Patent: Dec. 31, 2002

(54) ELECTRICAL EQUIPMENT AND CABLE SUPPORT ASSEMBLY

(75) Inventors: James H. Grant, Austin, TX (US); William McMillan, III, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 0 days.

(21) Appl. No.: 09/858,127

(22) Filed: May 15, 2001

(65) Prior Publication Data

US 2002/0092662 A1 Jul. 18, 2002

Related U.S. Application Data

(60) Provisional application No. 60/261,849, filed on Jan. 15, 2001, now abandoned.

(51) Int. Cl.[7] .............................. H02G 3/08; H01B 7/06
(52) U.S. Cl. .................. 174/50; 174/69; 174/DIG. 9; 361/608
(58) Field of Search .................. 174/50, 57, 69, 174/72 A, 135, 48, DIG. 9; 312/222, 223, 265.1, 265.4; 361/608, 725, 727, 326; 211/26

(56) References Cited

U.S. PATENT DOCUMENTS

| | | | | |
|---|---|---|---|---|
| 3,088,054 A | * | 4/1963 | Meyer | 174/DIG. 9 |
| 3,257,156 A | * | 6/1966 | Sisk et al. | 174/DIG. 9 |
| 3,295,905 A | * | 1/1967 | Sisk et al. | 174/69 |
| 3,647,936 A | * | 3/1972 | Dryg | 174/69 |
| 3,676,572 A | * | 7/1972 | Davies | 174/DIG. 9 |
| 3,710,199 A | * | 1/1973 | Cignoni, Jr. | 174/DIG. 9 |
| 4,353,518 A | * | 10/1982 | Taylor et al. | 248/60 |
| 4,614,383 A | * | 9/1986 | Polley et al. | 174/DIG. 9 |
| 5,339,379 A | * | 8/1994 | Kutsch | 385/135 |
| 5,381,315 A | * | 1/1995 | Hamaguchi et al. | 361/692 |
| 5,460,441 A | * | 10/1995 | Hastings et al. | 361/683 |
| 5,469,037 A | * | 11/1995 | McMurtey et al. | 312/223.2 |
| 5,571,256 A | * | 11/1996 | Good et al. | 211/151 |
| 5,726,866 A | * | 3/1998 | Allen | 361/683 |
| 5,746,389 A | * | 5/1998 | Willmann | 174/69 |
| 5,890,602 A | * | 4/1999 | Schmitt | 211/13.1 |
| 5,997,117 A | * | 12/1999 | Krietzman | 312/265.4 |
| 6,021,047 A | * | 2/2000 | Lopez et al. | 361/727 |
| 6,070,742 A | * | 6/2000 | McAnally et al. | 211/26 |
| 6,259,604 B1 | * | 7/2001 | Kuster | 361/724 |
| 6,305,556 B1 | * | 10/2001 | Mayer | 361/683 |
| 6,326,547 B1 | * | 12/2001 | Saxby et al. | 174/69 |
| 6,327,139 B1 | * | 12/2001 | Champion et al. | 174/DIG. 9 |
| 6,353,532 B1 | * | 3/2002 | Landrum et al. | 361/683 |

OTHER PUBLICATIONS

AFCO Modular Enclosure Systems & Data Comm Products Catalog regarding "Cable Management Arm Accessory Kit"; (1 page).
AMCO Engineering Co. Catalog regarding Cabinet Accessories, (1 page).

(List continued on next page.)

*Primary Examiner*—Chau N. Nguyen
*Assistant Examiner*—Angel R. Estrada
(74) *Attorney, Agent, or Firm*—Kennedy Covington Lobdell & Hickman, LLP

(57) ABSTRACT

A cable management appraratus for routing at least one cable from a first location to a second location in an electrical equipment support system. The cable management apparatus includes a flexible support member, which extends curvilinearly between the first location and the second location, and at least one retention feature disposed along the length of the flexible support member for supporting at least one cable.

36 Claims, 4 Drawing Sheets

OTHER PUBLICATIONS

Product Information for American Power Conversion Corp. including pages from the Internet and Catalogs (5 pages).
BR Metal Technology, Inc. Catalog regarding Protective Enclosures for Computers (4 pages).
Product Information for Bud Industries, Inc. including pages from the Internet and Catalogs (3 pages).
Cooper B–Line, a Division of Cooper Industries, Catalog (1 page).
Damac Products, Inc.—Cabinet Options, Catalog (2 pages).
Damac Products, Inc.—Internet pages regarding Tower Shelf Cable Arm (2 pages).
DataTel, Catalog page regarding Rackmount Computer Keyboard (1 page).
Encore Enclosure Systems, Catalog page regarding Shelves (1 page).
Everest Broadband Networks, Catalog page regarding Keyboard Tray (1 page).
Great Lakes Case & Cabinet Co.—Catalog and Internet pages regarding Sliding Shelves (11 pages).
Hoffman Enclosures, Inc., Catalog pages regarding Keyboard Compartment (2 pages).
Ice Cube Inc., Catalog (1 page).
National Computers & Electronic Enclosures Corp., Catalog (2 pages).
Rackit Technology Corporation Internet page regarding Unfolding Cable Management Arm Kit (1 page).
Rittal Limited, Catalog page regarding Cable carrier—hinged (1 page).
Southwest Data Products, Catalog pages regarding Single Tower Roll Out Shelf (2 pages).
Systems Manufacturing Corporation, Catalog page regarding Multi Rack design (1 page).
X–Mark/CDT, Internet pages regarding Pivot Cable Retractor (4 pages).

* cited by examiner

ELECTRICAL EQUIPMENT AND CABLE SUPPORT ASSEMBLY

CROSS REFERENCE TO RELATED APPLICATIONS

This application is entitled to the benefit of, and claims priority to, U.S patent application Ser. No. 60/261,849, filed Jan. 15, 2001 now abandoned and entitled "ELECTRICAL EQUIPMENT AND CABLE SUPPORT ASSEMBLY."

FIELD OF THE PRESENT INVENTION

The present invention relates generally to the field of shelves for supporting computer equipment in a frame or cabinet, and more particularly to the field of sliding network equipment shelves utilizing a flexible, space-saving cable management apparatus to retain and support cables in a plurality of shelf deployment positions.

BACKGROUND OF THE PRESENT INVENTION

As is well known, electrical component racks, frames and cabinets are heavily utilized to store computer equipment and other electrical equipment of a variety of types. The equipment may be mounted on or in electrical equipment support systems such as racks, frames, cabinets and the like, collectively referred to herein as "cabinets," in a variety of ways. For example, equipment may be attached directly to the structure of a cabinet, placed on a shelf, or the like. Shelves for supporting such equipment are generally of two types: static and moveable. Static shelves are those which remain stationary with respect to the cabinet to which they are attached, while moveable shelves may be moved relative to the cabinet, usually in order to provide more convenient access to the equipment stored thereon. Moveable shelves generally take the form of sliding shelves which may be moved laterally along slides, rollers or the like, in and out of the cabinet.

A major concern with regard to moveable shelves in general, and sliding shelves in particular, is the disposition of the cables, wires and the like, referred to herein as "cables," which are attached to the equipment stored on the shelves. As such a shelf is moved outward from the cabinet, the equipment stored thereon is likewise moved, pulling and straining the cables attached thereto with it. Obviously, the cables must therefore be arranged to provide enough slack to enable the equipment to be moved outward the desired distance. In addition, however, provision must be made to keep the cables from becoming entangled and from catching on portions of the cabinet or of other equipment as the cables are moved out, and for restoring the cables to their original positions when the equipment is moved back into the cabinet. Further, all of this cable management must take place while preserving the integrity of the power supplied through the cables or the signals likewise transmitted through the cables. Because of the difficulties inherent in such cable management, users often dispense with the extra expense of sliding or other moveable shelves altogether in favor of a static system which utilizes only static cable management apparatuses such as stationary cable raceways, wiring shelves, permanently-attached O- or D-ring brackets, or the like.

Most prior art solutions to the problem of managing cables in a moveable shelf environment utilize a hinged cable management arm attached between the rear of the shelf and the rear of the cabinet. Each arm includes a plurality of arm segments, with a typical number of segments being four, and each pair of adjacent segments is connected by a hinge. The arm is capable of gradually unfolding from a folded position, in which the segments are generally folded on top of each other, to an unfolded position, in which the segments are unfolded, sometimes to the point, or nearly the point, of forming a straight line from one end to the other.

The arm is typically disposed in one of two arrangements. In a first arrangement, the arm is connected between the rear of the shelf and a vertical mounting rail of the cabinet. In this arrangement, the folded arm extends horizontally along the rear edge of the shelf, and the folding and unfolding motion is generally co-planar with the shelf itself. In a second arrangement, the arm is connected between the rear of the shelf and a horizontal frame member installed between the vertical mounting brackets or between the shelf slide assembly attached thereto. In this arrangement, the folded arm extends vertically above or below the surface of the shelf, and the folding and unfolding motion occurs in a plane which is generally perpendicular to the plane of the shelf.

Once the hinged cable management arms are installed, cables may be routed along the arms and held in place by wrapping plastic tie wraps, Velcro® straps or buckle straps around the cables and the arm. As the shelf slides outward, the hinged cable management arm unfolds and the cables attached to it unfold in unison with the motion of the arm. As the shelf slides back inward into the cabinet, the hinged cable management arm refolds, and the cables attached to it refold in unison with the motion of the arm.

Unfortunately, horizontally and vertically hinged cable management arms both suffer from a number of disadvantages. First, both types consume a considerable amount of space behind the shelf and may obstruct air flow horizontally through the cabinet. Vertically hinged cable management arms may take up more vertical space than the equipment mounted on the shelf, thereby limiting the amount of equipment that may be stored in the cabinet or how far a shelf may be extended from the cabinet. Further, vertically hinged cable management arms require the presence of a horizontal frame member connected behind the sliding shelf Such frame members are not commonly utilized except at the bottom of the cabinet, and thus such a vertically hinged cable management arm must either be installed at the bottom of the cabinet, or else an additional horizontal frame member must be purchased and installed. In addition, the structure and operation of prior art cable management arms relative to the sliding shelves to which they are attached demands that they be mounted relatively precisely, making the installation procedure time-consuming and tedious.

Alternative solutions to the problem of managing cables in a moveable shelf environment likewise suffer from significant problems. For example, cord winders may be used to roll and unroll cables as the equipment is moved in and out. However, when installed, each cord winder occupies a significant amount of valuable space above or next to the shelf. Further, a separate cord winder must generally be utilized for each separate cable. In addition, cord winders become easily tangled as the cables become bent and kinked. Similarly, gravity-based solutions allow cables to drop into a vertical space at the back of the cabinet behind the equipment, and consume little additional space, but the weight of the cables is frequently not enough to overcome the bends and kinks which develop in the cables and prevent the cables from dropping smoothly back into the vertical space. Further, a sufficient amount of vertical space must be available to contain the retracted cables when the shelf is moved back into the cabinet and the cables are pulled by gravity down into the space.

Thus, a need exists for a cable management solution which may be easily installed, which occupies little otherwise-usable space and which operates reliably.

Another problem encountered with regard to the selection of sliding or moveable shelves for use in cabinets and other electrical equipment support systems is the difficulty of installing the shelf, its slide assemblies and any cable management apparatus. Prior art sliding shelves and their associated cable management arms are typically constructed from steel and are thus quite heavy. Further, assembly and installation of these apparatuses is fairly complex, requiring a number of members to be attached together in relatively precise locations to enable free movement of the shelf and cable management arm. In addition, installation of the shelves and cable management arms typically requires considerable use of various tools. The installation complexity and tool requirements, coupled with the heavy weight of the apparatuses, makes installation of the apparatuses prohibitively difficult for one person to handle by himself. Thus, a need exists for a sliding shelf and cable support assembly which may be easily installed by only one installer using a minimum of tools.

SUMMARY OF THE PRESENT INVENTION

Briefly summarized, the present invention relates to an electrical equipment and cable support assembly for use in a cabinet. Broadly defined, a cable management apparatus according to one aspect of the present invention is operative to route at least one cable from a first location to a second location in an electrical equipment support system and includes: a flexible support member extending curvilinearly between the first location and the second location; and at least one retention feature disposed along the length of the flexible support member for supporting at least one cable.

In features of this cable management apparatus, the electrical equipment support system includes a shelf mounted in a cabinet, and the flexible support member is connected between the cabinet and the shelf; the shelf moves relative to the cabinet, and the flexible support member remains connected between the cabinet and the shelf while the shelf moves; the flexible support member moves in conjunction with the movement of the shelf, the flexible support member has an upper edge extending continuously from the first location to the second location, and substantially all of the upper edge remains disposed in a single plane while the flexible support member moves in conjunction with the shelf; the flexible support member is a belt; and the portion of the flexible support member extending between the first and second locations is generally uniformly flexible.

In another aspect of the present invention, a cable management apparatus for routing at least one cable from a first location to a second location in an electrical equipment support system includes: a belt; and at least one retention feature disposed along the length of the belt for supporting at least one cable.

In features of this aspect, the electrical equipment support system includes a shelf mounted in a cabinet, and the belt is connected between the cabinet and the shelf; the shelf moves relative to the cabinet, and the belt remains connected between the cabinet and the shelf while the shelf moves; the belt moves in conjunction with the movement of the shelf, the belt has an upper edge extending continuously from the first location to the second location, and substantially all of the upper edge remains disposed in a single plane while the belt moves in conjunction with the shelf; and the belt extends curvilinearly between the first location and the second location.

In yet another aspect of the present invention, an electrical equipment and cable support assembly for supporting an electrical component and at least one cable attached thereto in an electrical equipment support system includes: a moveable equipment support apparatus mounted in the electrical equipment support system; and a curvilinear support member, connected between the moveable equipment support apparatus and the electrical equipment support system, for routing at least one cable from an electrical component supported by the moveable equipment support apparatus to the electrical equipment support system.

In features of this aspect, the moveable equipment support apparatus is a sliding shelf assembly; the portion of the curvilinear support member extending between the moveable equipment support apparatus and the electrical equipment support system is generally uniformly flexible; the moveable equipment support apparatus includes at least one slide assembly having an inner slide member and an outer slide member, and the curvilinear support member is connected between the inner slide member and the electrical equipment support system; the curvilinear support member has an upper edge extending continuously from the moveable equipment support apparatus to the electrical equipment support system, and the upper edge defines a plane; and the plane defined by the upper edge of the curvilinear support member is generally horizontal.

In still another aspect of the present invention, an electrical equipment and cable support assembly for supporting an electrical component and at least one cable attached thereto in an electrical equipment support system, which has at least a first cable support member mounting location, includes: an equipment support apparatus, which has at least a second cable support member mounting location, mounted in the electrical equipment support system; and a cable support member, which has first and second ends and a temporary attachment portion disposed generally intermediate the first and second cable support member ends, for routing at least one cable from an electrical component supported by the equipment support apparatus to the electrical equipment support system, wherein the cable support member may be mounted in at least two positions including a normal use mounting position in which the first end is connected to the first cable support member mounting location and the second end is connected to the second cable support member mounting location, and a temporary installation mounting position in which the temporary attachment portion is connected to one of the cable support member mounting locations.

In features of this aspect, the equipment support apparatus is a sliding support assembly; when the cable support member is mounted in one temporary installation mounting position, the temporary attachment portion is connected to the first cable support member mounting location on the electrical equipment support system, the second cable support member end is connected to the second cable support member mounting location, and the first cable support member end is disconnected from both the first and second cable support member mounting locations; when the cable support member is mounted in another temporary installation mounting position, the temporary attachment portion of the cable support member is connected to the second cable support member mounting location, the first cable support member end is connected to the first cable support member mounting location, and the second cable support member end is disconnected from both the first and second cable support member mounting locations; the cable support member is a flexible belt; and the cable support member extends curvilinearly between the electrical component supported by the equipment support apparatus to the electrical equipment support system.

The present invention also includes a method of installing at least one cable on a cable support member having opposite ends and a temporary attachment portion disposed generally intermediate the cable support member ends, which are mountable to respective mounting locations in an electrical equipment support system, wherein the method includes the steps of: temporarily attaching the temporary attachment portion of the cable support member to one of the mounting locations; after temporarily attaching the temporary attachment portion, routing at least one cable along the cable support member; detaching the temporary attachment portion of the cable support member from the vacated mounting location; and attaching an end of the cable support member to the vacated mounting location.

In features of this method, the method further includes the step of temporarily detaching an end of the cable support member from one of the mounting locations before temporarily attaching the temporary attachment portion of the cable support member, and temporarily attaching includes temporarily attaching the temporary attachment portion of the cable support member to the vacated mounting location; the step of temporarily attaching the temporary attachment portion of the cable support member includes temporarily exposing substantially all of the cable support member from the temporary attachment portion to the temporarily detached cable support member end from underneath a first planar surface on the electrical equipment support system; the first planar surface is the top surface of a shelf; and the cable support member is a flexible belt.

The present invention also includes a method of installing a sliding equipment support assembly in an electrical equipment support system wherein the method includes the steps of: mounting a pair of mounting bracket assemblies and a pair of slide assemblies in the electrical equipment support system; after the slide assemblies are mounted in the electrical equipment support system, placing a shelf on the slide assemblies; and after placing the shelf on the slide assemblies, fastening the shelf to the slide assemblies.

In features of this method, the step of mounting a pair of mounting bracket assemblies and a pair of slide assemblies includes mounting a mounting bracket assembly, having a previously-attached slide assembly, in the electrical equipment support system; the step of mounting a pair of mounting bracket assemblies and a pair of slide assemblies includes the steps of first mounting the mounting bracket assemblies in the electrical equipment support system and then attaching a slide assembly to each mounting bracket assembly; the method further includes the steps of providing a plurality of L-slots in the shelf and providing the slide assemblies with a plurality of inwardly-facing protrusions, and the step of placing a shelf on the slide assemblies includes lowering the L-slots onto the protrusions and horizontally moving the shelf relative to the slide assemblies until the protrusions reach the ends of the L-slots; the method further includes the step of attaching a cable management apparatus for supporting cables to the shelf; the cable management apparatus is a flexible belt; the method further includes the steps of providing at least one perforation in the flexible belt, providing at least one retention feature having a plug, and attaching the retention feature to the flexible belt by inserting the plug through the opening in the flexible belt; the step of attaching the cable management apparatus includes attaching the cable management apparatus underneath the shelf; and the step of attaching the cable management apparatus includes attaching the cable management apparatus between one end of a slide assembly and the electrical equipment support system.

In a still further aspect of the present invention, a sliding equipment support assembly for supporting at least one electrical component in an electrical equipment support system includes: a shelf having a top member and at least two side members, each of which has a lower edge penetrated by at least one L-shaped slot; and at least two slide assemblies, each of which has at least an inner slide member and an outer slide member, and each inner slide member having at least one protrusion projecting through the L-shaped slot along the lower edge of one of the shelf side members.

In features of this aspect, the sliding equipment support assembly further includes at least two mounting bracket assemblies, wherein a slide assembly is supported by each mounting bracket; each mounting bracket assembly is supported by the electrical equipment support system; and the sliding equipment support assembly further includes a cable management apparatus connected between the sliding equipment support assembly and the electrical equipment support system for routing at least one cable from an electrical component supported by the shelf to the electrical equipment support system, wherein substantially all of the cable management apparatus extends underneath the shelf when the shelf is retracted within the electrical equipment support system.

In yet another aspect of the present invention, an electrical equipment and cable support assembly for supporting an electrical component and at least one cable attached thereto in an electrical equipment support system, having at least a first cable support member mounting location, includes: a shelf assembly mounted in the electrical equipment support system and including a shelf having a top member and at least two side members which each have a lower edge penetrated by at least one L-shaped slot, at least two slide assemblies which each have at least an inner slide member, and an outer slide member having at least one protrusion projecting through the L-shaped slot along the lower edge of one of the shelf side members, and at least a second cable support member mounting location; and a cable management apparatus having a flexible cable support member extending curvilinearly between the shelf assembly and the electrical equipment support system and having at least one retention feature disposed along the length of the cable support member for routing at least one cable from an electrical component supported by the shelf to the electrical equipment support system, wherein the cable support member, which has first and second ends and a temporary attachment portion disposed generally intermediate the first and second ends, may be mounted in at least two positions including a normal use mounting position in which the first end is connected to the first cable support member mounting location and the second end is connected to the second cable support member mounting location, and a temporary installation mounting position in which the temporary attachment portion is connected to one of the cable support member mounting locations.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
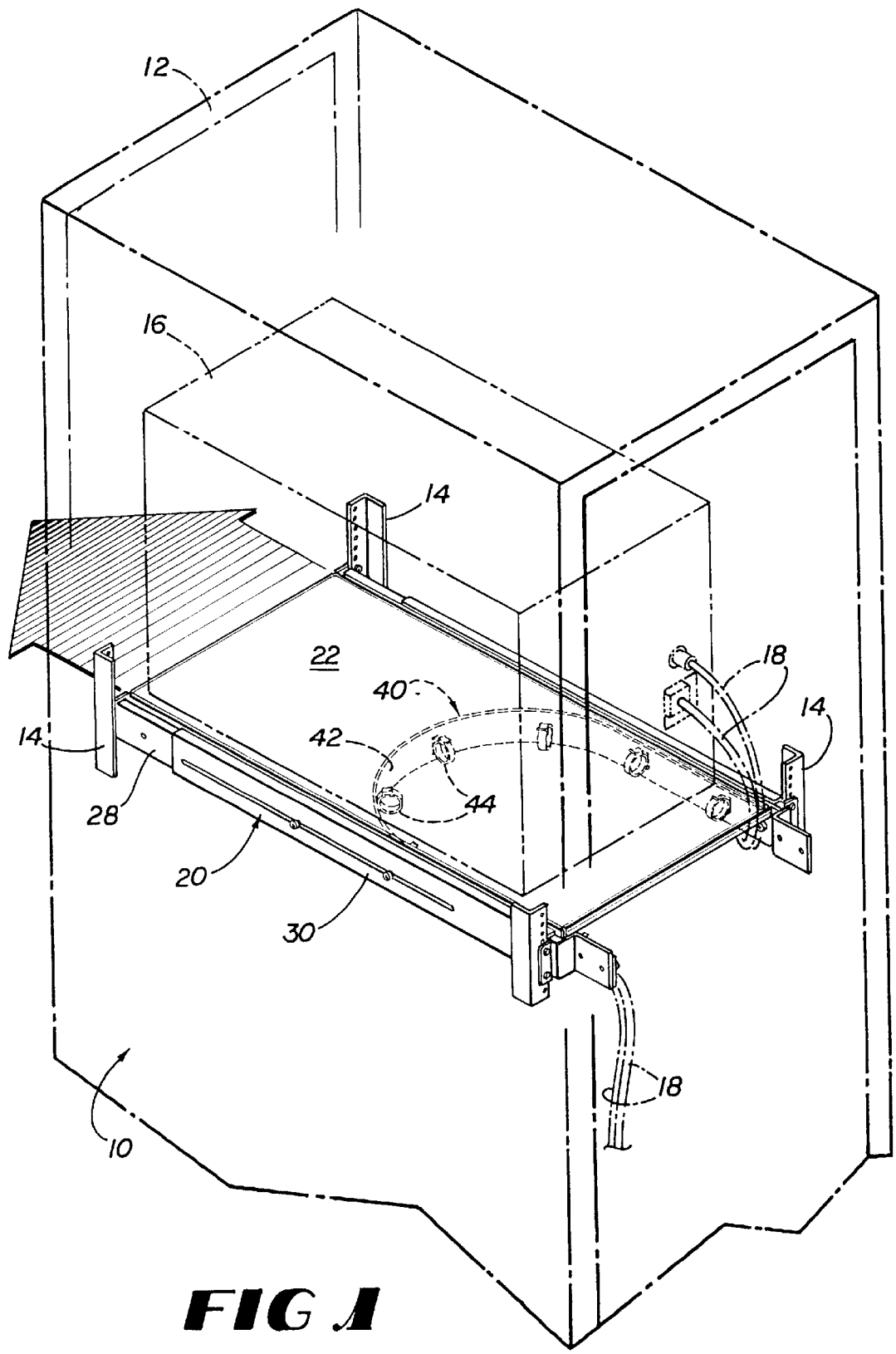
FIG. 1 is a rear perspective view of a sliding equipment and cable support assembly supporting a computer equipment component in a retracted shelf deployment state in an equipment cabinet, in accordance with the present invention.

FIG. 1 shows a sliding equipment and cable support assembly 10 supporting a computer or other electrical equipment component 16 in an equipment cabinet 12 in accordance with the preferred embodiments of the present invention. An equipment cabinet 12 suitable for use with the present invention is disclosed in the commonly-assigned U.S. Pat. No. 5,997,117 to Krietzman for a "RACK FRAME CABINET," the entirety of which is hereby incorporated by reference. It should be obvious, however, that the sliding equipment and cable support assembly 10 of the present invention is adaptable for use with a wide variety of electrical equipment support systems, of which the cabinet disclosed in U.S. Pat. No. 5,997,117 is merely an example.

Figure 2:
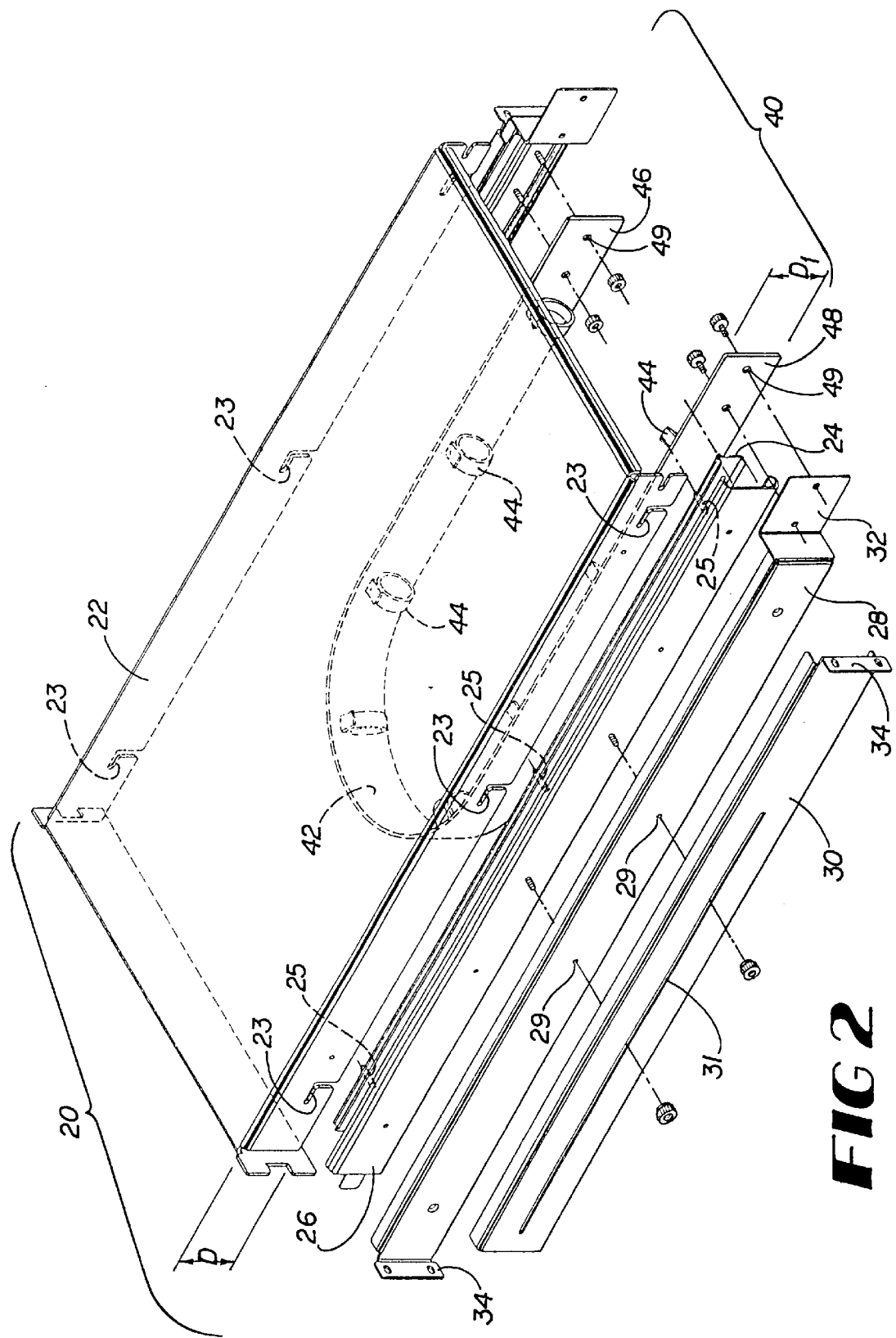
FIG. 2 is an exploded side perspective view of the sliding equipment support apparatus and the cable management apparatus of FIG. 1.

The sliding equipment and cable support assembly 10 comprises a sliding equipment support apparatus 20 and a cable management apparatus 40. FIG. 2 is an exploded side perspective view of the sliding equipment support apparatus and the cable management apparatus of FIG. 1. The sliding equipment support apparatus 20 may be constructed from lightweight aluminum and includes a shelf 22, a pair of slide assemblies and a pair of mounting bracket assemblies. The shelf 22 has a height of D and includes a top, a front and two sides, and each of the sides has a plurality of L-slots 23 extending upward from its lower edge. Each slide assembly includes an inner slide member 24 and an outer slide member 26 interconnected such that the inner slide member 24 may slide longitudinally relative to the outer slide member 26. It should be obvious, however, that additional slide members may be incorporated into each slide assembly. A plurality of protrusions 25 project inwardly from each inner slide member 24 and are disposed to extend through corresponding L-slots 23 in the side members of the shelf 22. Each mounting bracket assembly includes a fixed mounting bracket 28 and an adjustable mounting bracket 30. Each fixed mounting bracket 28 has a plurality of apertures disposed along its length and a belt mounting plate 32, inwardly offset from the remainder of the fixed mounting bracket 28, disposed at its rearward end.

Each adjustable mounting bracket 30 may be attached to its corresponding fixed mounting bracket 28 by inserting fasteners through apertures 29 in the fixed mounting bracket 28 and through a longitudinally extending slot 31 in the adjustable mounting bracket 30. The length of each mounting bracket assembly is controlled by the disposition of the fasteners along the length of the slot 31, thus allowing each mounting bracket assembly to be adjusted to correspond to the distance between vertical mounting brackets 14 in the selected cabinet 12. A perpendicularly-extending mounting flange 34 is disposed at the rearward end of each adjustable mounting bracket 30 and at the forward end of each fixed mounting bracket 28. Each mounting bracket assembly is affixed between a pair of vertical mounting brackets 14 by inserting fasteners through apertures in the mounting flanges 34 and through corresponding apertures in the vertical mounting brackets 14.

The cable management apparatus 40 includes a flexible support member 42 and a plurality of retention features 44 disposed along the length of the belt 42. In a preferred embodiment, the flexible support member 42 is a belt having a height $D_1$ and formed from a clear polycarbonate material to provide the requisite flexibility and to enable a user to view cables 18 through the body of the belt. However, it should be obvious to one of ordinary skill in the art that the flexible support member 42 may be formed from any member or collection of members, such as a linked chain or the like, which is generally uniformly flexible along its length, allowing it to be readily reshaped from one curvilinear shape to another. Generally, all of the reformation of the flexible support member 42, referred to hereinafter as a "belt," occurs in a single horizontal plane or strata, having a height $D_1$ defined by the upper and lower surfaces of the belt 42, and the belt 42 retains its shape in the vertical direction without drooping significantly out of the single horizontal plane or strata. However, it should be obvious that the belt 42 or the disposition of the belt 42 relative to the sliding equipment support apparatus 20 may be adapted to permit reformation of the belt 42 in a plane or strata which is not horizontal or not parallel to the sliding equipment support apparatus 20.

Figure 3:
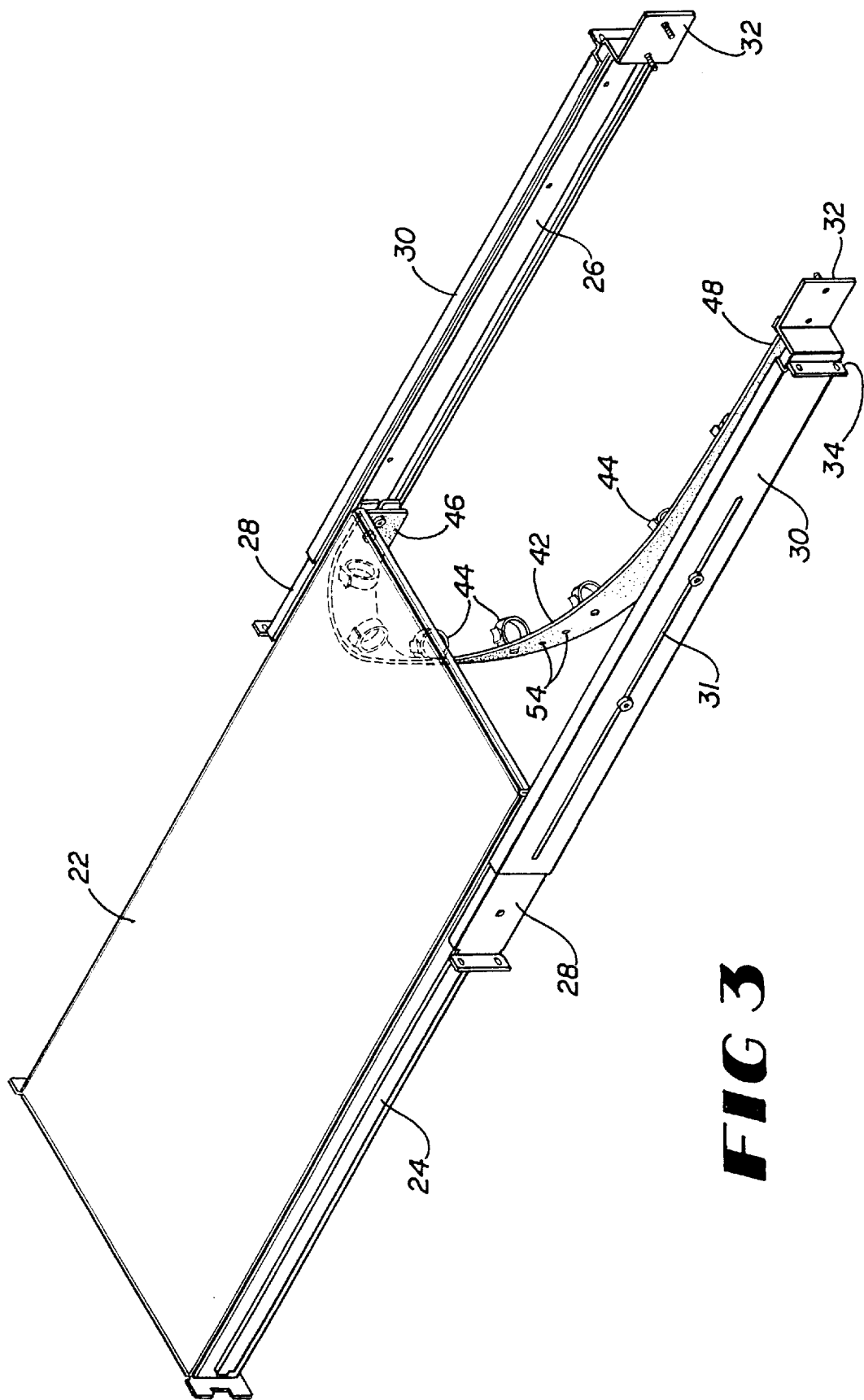
FIG. 3 is a side perspective view of the sliding equipment and cable support assembly of FIG. 1, shown in an extended shelf deployment state.

A first end 46 of the belt 42 is anchored to one end of the inner slide member 24 on one side of the shelf 22, while a second end 48 of the belt 42 is anchored to the belt mounting plate 32 of the fixed mounting bracket 28 on the opposite side of the shelf 22. Each end 46, 48 may be anchored by inserting threaded fasteners through apertures 49 disposed proximate each end, and designed for that purpose, and securing the fasteners with thumb screws or other threaded fasteners provided for that purpose. A further set of auxiliary mounting apertures 54 is provided for temporary use during installation, as described elsewhere herein. Because the height of the belt 42 is generally less than the height D of the shelf 22, the portion of the belt 42 intermediate the two ends 46, 48 may extend curvilinearly underneath the shelf 22 in the space bounded by the top, front and side members of the shelf 22. As perhaps best illustrated in FIGS. 1 and 3, the entirety of the surfaces forming the upper edge of the belt 42 thus lie substantially within a first plane, and the entirety of the surfaces forming the lower edge of the belt 42 thus lie substantially within a second plane. Significantly, the only space consumed by the cable management apparatus 40 is the space underneath the shelf 22 which may otherwise be generally unusable.

In a preferred method of installing the computer equipment and cable support assembly 10, each mounting bracket assembly, which may or may not have a slide assembly initially attached thereto, is first adjusted to match the distance between vertical mounting brackets 14 of the chosen cabinet 12. Once the mounting bracket assemblies are properly sized, each mounting flange 34 may be fastened to its respective vertical mounting bracket 14 at the desired height. The outer slide member 26 of each slide assembly may be affixed to the inner surface of the corresponding mounting bracket assembly before or after the installation of the mounting bracket assembly in the cabinet 12 using either the same fasteners used to fasten the mounting bracket assemblies together or using additional fasteners. Once the slide assemblies and their respective mounting bracket assemblies are installed in the cabinet 12, the inner slide members 24 may be adjusted relative to their respective outer slide members 26 until the protrusions 25 on one inner slide member 24 are directly across from the protrusions 25 on the opposite inner slide member 24. The shelf 22 may then be mounted on the slide assemblies by positioning the shelf 22 such that the L-slots 23 are directly above the protrusions 25 on the respective inner slide members 24 and then lowering the shelf 22 so that the protrusions 25 slide upward relative to the shelf 22 and into the L-slots 23. Once the protrusions 25 are fully seated in the tops of the L-slots 23, the shelf 22 may then be moved rearward relative to the inner slide members 24 until the protrusions 25 are fully seated in the ends of the L-slots 23. In this position, the shelf 22 is prevented from moving either upward or downward. The belt 42, the first end 46 of which may premounted to the rearward end of a selected inner slide member 24, may then be installed by attaching the second end 48 to the belt mounting plate 32 using suitable fasteners. Finally, the shelf 22 may be affixed to the slide assemblies by inserting additional fasteners through apertures in the inner slide members 24 and in the shelf 22, by substituting fasteners for the protrusions 25, by utilizing the fasteners used for attaching the belt, or some combination of the above, along with appropriate mating fasteners, such as thumb screws.

The sliding equipment and cable support assembly 10 may thus be easily installed by a single installer acting alone, and using a minimal number of tools, by first installing the mounting bracket assemblies, then the slide assemblies (if not previously attached to the mounting bracket assemblies), then placing the shelf 22 on the slide assemblies and maneuvering it into position. The attachment of the shelf 22 to the slide assemblies may be deferred until after the shelf 22 is in place. Once installation of the sliding equipment support apparatus 20 is complete, the cable management apparatus 40 may easily be installed underneath the shelf 22 merely by inserting fasteners through the designated apertures 49 on the belt ends 46, 48 and the respective slide member 26 and belt mounting plate 32. Each mounting bracket 28, 30, slide member 24, 26, and cable management apparatus 40 may thus easily be held with one hand while fasteners or the like are inserted with the other, and the shelf 22 may be placed in position with two hands and then attached with one hand. Finally, if separate retention features 44 are utilized, they may be easily inserted into the belt 42 and manipulated to allow the insertion of cables 18 with one hand, leaving the other hand free to hold the cables 18 or the like.

Once the computer equipment and cable support assembly 10 is successfully mounted in the cabinet 12, one or more computer equipment component 16 may be installed on the sliding equipment and cable support assembly 10 as desired. The cable 18 may then be routed from the computer equipment component 16 as next described. Beginning at the cable's point of connection to the computer equipment component 16, the cable 18 may be routed to the first end 46 of the belt 42, which remains in a fixed relationship with the shelf 22 and anything supported on the top member thereof, as the shelf 22 is moved forward and rearward via the slide assemblies. From the first belt end 46, the cable 18 may be routed through each of the retention features 44 on the belt 42 until the second end 48 of the belt 42 is reached. The second belt end 48 remains in fixed relationship with the mounting bracket assemblies, the vertical mounting brackets 14, and the cabinet 12 itself. Thus, once installed on the cable management apparatus 40, the cable 18 may be routed from the second end 48 of the belt 42 to any typical destination, including another computer equipment component 16 within the cabinet 12, a raceway above or adjacent the cabinet 12, an under-floor routing location, or the like.

In a first preferred embodiment, the retention features 44 are releasable clips, each of which has an O-ring attached to a stud which may be inserted through the belt 42. The clips 44 may be pre-assembled to the belt 42, or may be installed by the user. The studs are each preferably equipped with a round plug and pin feature to facilitate the insertion of the stud through a punched hole or cross cut in the belt 42 and the subsequent retention therein, thus facilitating easy, tool-free assembly. Cables 18 may be installed in this type of retention feature 44 by opening each O-ring by releasing its clip and inserting the cables 18 through the respective sides of the O-rings. The cables 18 may be retained within the O-rings by closing the clips again. By repeating this process, the cables 18 may thus be routed from one end 46 of the belt 42 to the other 48.

Figure 5:
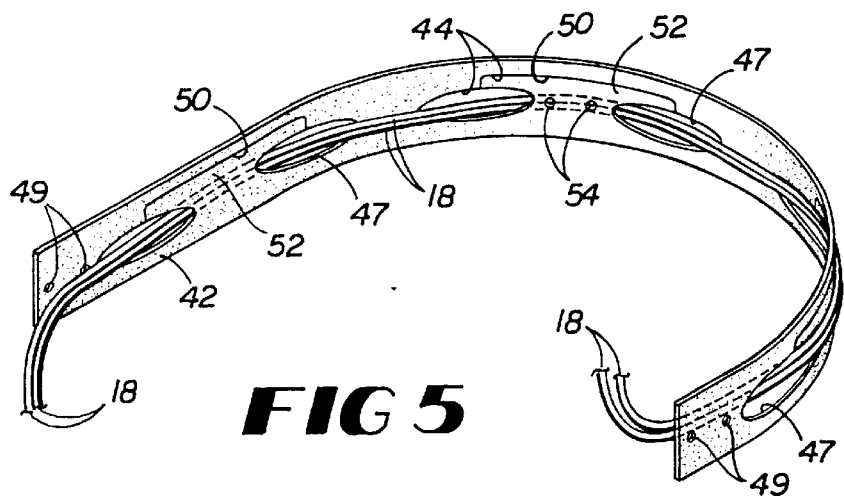
FIG. 5 is a perspective view of an alternative embodiment of a cable management apparatus for use with the sliding equipment support apparatus of FIG. 1.
Figure 6:
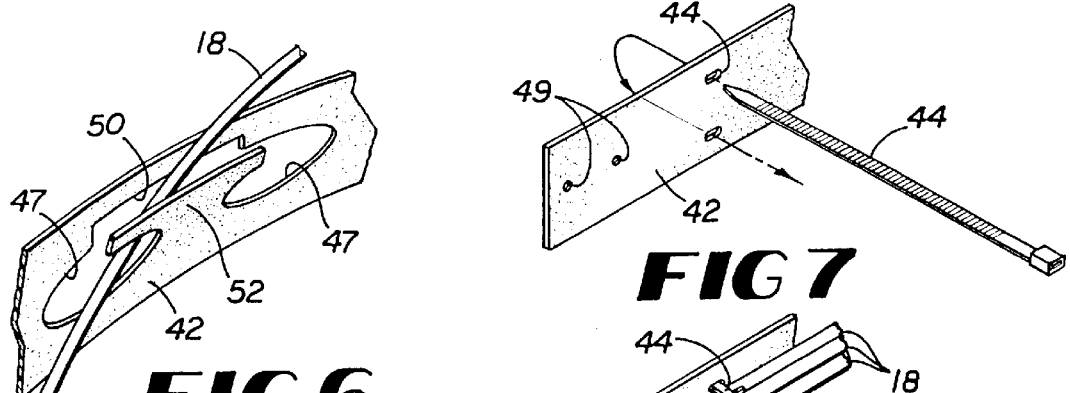
FIG. 6 is a partial perspective view of a portion of the alternative cable management apparatus of FIG. 5.

FIG. 5 is a perspective view of an alternative embodiment of a cable management apparatus 40 for use with the sliding equipment support apparatus 20 of FIG. 1. In this second preferred embodiment, the retention features 44 include elliptical openings 47, each adjacent pair of which is connected by a generally longitudinally-extending seam 50. It should be obvious, however, that the shapes of both the openings 47 and the seams 50 may vary without departing from the scope of the present invention. Each seam 50 and the openings 47 it connects create a deformable flap 52. As best illustrated in FIG. 6, cables 18 may be installed in this type of retention feature 44 by bending each flap 52 away from the rest of the belt 42 and inserting the cables 18 behind the flap 52 such that the cables 18 are routed through one opening 47 to the other side of the belt 42 and emerge again through the next opening 47. By repeating this process, the cables 18 may thus be routed from one end 46 of the belt 42 to the other 48.

Figure 7:
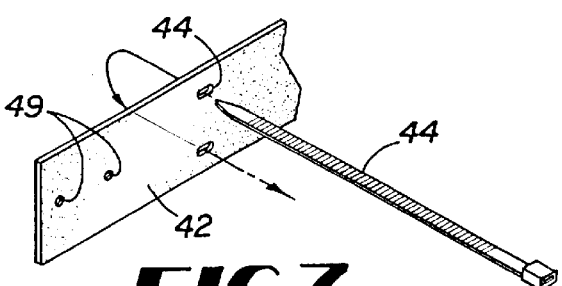
FIG. 7 is a partial perspective view of a portion of another alternative cable management apparatus for use with the sliding equipment support apparatus of FIG. 1.
Figure 8:
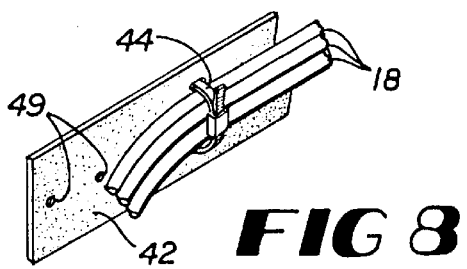
FIG. 8 is a partial perspective view of cables installed on the alternative cable management apparatus of FIG. 7.

FIGS. 7 and 8 are partial perspective views of a portion of another alternative embodiment of a cable management apparatus 40 for use with the sliding equipment support apparatus 20 of FIG. 1. In this third preferred embodiment, the retention features 44 are plastic tie wraps inserted through small longitudinal slots in the belt 42. Each tie wrap may be wrapped around a bundle of cables 18 and closed in the ordinary manner as shown in FIG. 8. By repeating this process, the cables 18 may thus be routed from one end 46 of the belt 42 to the other 48. Further, although tie wraps are illustrated, it should be obvious that other similar devices including VELCRO® straps, buckle straps, or the like, may instead be used.

Figure 4:
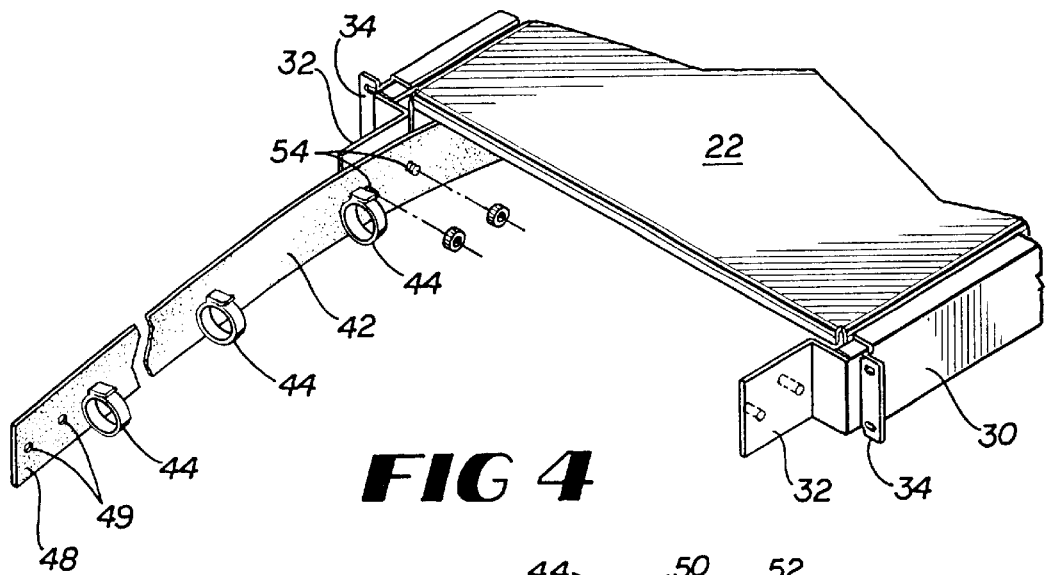
FIG. 4 is a partial perspective view of the cable management apparatus of FIG. 1, deployed in a temporary installation position.

FIG. 4 is a partial perspective view of the cable management apparatus 40 of FIG. 1, deployed in a temporary installation position. This arrangement may be useful during the process of installing, maintaining or deinstalling cables 18 in the retention features 44 by more effectively exposing at least a portion of the belt 42 to an installer or other user. To place the belt 42 in the temporary installation position, the second end 48 of the belt 42 may be detached from the belt mounting plate 32 and pulled rearward to expose more of the belt 42 from beneath the shelf 22. An intermediate portion of the belt 42 may then be temporarily attached to the belt mounting plate 32 by inserting the same fasteners through apertures on the belt mounting plate 32 and then through the auxiliary mounting apertures 54 in the belt 42. The belt 42 may be retained on the fasteners in this position in the same way as in the normal use position. Placing and holding the belt 42 in this temporary installation position enables a user to more readily view and access the belt 42 and its retention features 44 by exposing retention features 44 from underneath the shelf 22. The belt 42 may then be returned to its normal use position once installation, maintenance or deinstallation is complete by reversing the above-described steps.

Once the cables 18 are installed and routed as desired, the sliding equipment and cable support assembly 10 may be operated as next described. The sliding equipment and cable support assembly 10 is deployed in its retracted state with the cable management apparatus 40 installed in its normal use position underneath the shelf 22. When a user wishes to extend the shelf 22 from the cabinet 12, the user may move the shelf 22 forward along the slide assemblies. As the shelf 22 moves forward, the first end 46 of the belt 42 is forced outward as well, unfurling and straightening the belt 42 between the first end 46 of the belt 42 and the anchor point of the second end 48 at the belt mounting plate 32. Thus, in the retracted shelf deployment state or in any extended shelf deployment state, the cables 18 remain routed from their connection point at the computer equipment 16 to the first end 46 of the belt 42, through the retention features 44 along the belt 42 to the second end 48 of the belt 42 and from there to their respective destinations. At all times, the portions of the cables 18 between the computer equipment 16 and the first belt end 46 remain in a fixed relationship with the shelf 22, while the portions of the cables 18 from the second belt end 48 to their final destination remain in a fixed relationship with the vertical mounting brackets 14 and the rest of the cabinet 12. Finally, the portion of the cables 18 retained within the retention features 44 remain in a semi-fixed relationship with the belt 42 as the cables 18 bend and unbend in unison with the belt 42 as the shelf 22 is moved. When the user is ready to return the sliding equipment and cable support assembly 10 back into the cabinet 12, the user may move the shelf 22 rearward along the slide assemblies. As the shelf 22 moves rearward, the first end 46 of the belt 42 is forced inward as well, furling the belt 42 back underneath the shelf 22. Once again, as the shelf 22 is moved, the relationships described above are maintained.

It will therefore be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiments, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

What is claimed is:

1. A cable management apparatus for routing at least one cable from a first portion of an electrical equipment support system to a second portion of the electrical equipment support system, wherein the first portion is movable relative to the second portion, the apparatus comprising:

a flexible support member extending curvilinearly between the first and second portions of the electrical equipment support system, wherein the flexible support member moves in conjunction with the movement of the first portion of the electrical equipment support system, wherein the flexible support member remains connected between the first and second portions of the electrical equipment support system while the first portion moves, wherein the flexible support member has an upper edge extending continuously from the first portion of the electrical equipment support system to the second portion of the electrical equipment support system, and wherein substantially all of the upper edge remains disposed in a single plane while the flexible support member moves in conjunction with the first portion of an electrical equipment support system; and at least one retention feature disposed along the flexible support member for supporting at least one cable.

2. The cable management apparatus of claim 1, the electrical equipment support system including a shelf and a stationary structure, wherein the flexible support member is connected between the shelf and the stationary structure of the electrical equipment support system.

3. The cable management apparatus of claim 1, wherein the flexible support member is a belt.

4. The cable management apparatus of claim 1, wherein the portion of the flexible support member extending between the first and second portions is generally uniformly flexible.

5. An electrical equipment and cable support assembly for supporting an electrical component and at least one cable attached thereto in an electrical equipment support system, the assembly comprising:

a moveable equipment support apparatus mounted in the electrical equipment support system; and a curvilinear support member, connected between the moveable equipment support apparatus and the electrical equipment support system, for routing at least one cable from an electrical component supported by the moveable equipment support apparatus to the electrical equipment support system, wherein the curvilinear support member has an upper edge extending continuously from the moveable equipment support apparatus to the electrical equipment support system, and wherein the upper edge defines a plane.

6. The electrical equipment and cable support assembly of claim 5, wherein the moveable equipment support apparatus is a sliding shelf assembly.

7. The electrical equipment and cable support assembly of claim 5, wherein the portion of the curvilinear support member extending between the moveable equipment support apparatus and the electrical equipment support system is generally uniformly flexible.

8. The electrical equipment and cable support assembly of claim 5, wherein the moveable equipment support apparatus includes at least one slide assembly having an inner slide member and an outer slide member, and wherein the curvilinear support member is connected between the inner slide member and the electrical equipment support system.

9. The electrical equipment and cable support assembly of claim 5, wherein the plane defined by the upper edge of the curvilinear support member is generally horizontal.

10. An electrical equipment and cable support assembly for supporting an electrical component and at least one cable attached thereto in an electrical equipment support system, the electrical equipment support system including at least a first cable support member mounting location, wherein the assembly comprises:

an equipment support apparatus mounted in the electrical equipment support system, the equipment support apparatus having at least a second cable support member mounting location; and a cable support member for routing at least one cable from an electrical component supported by the equipment support apparatus to the electrical equipment support system, the cable support member including first and second ends and a temporary attachment portion disposed generally intermediate the first and second cable support member ends, wherein the cable support member may be mounted in at least two positions including:
a normal use mounting position, wherein the first end is connected to the first cable support member mounting location and the second end is connected to the second cable support member mounting location; and
a temporary installation mounting position, wherein the temporary attachment portion is connected to one of the cable support member mounting locations.

11. The electrical equipment and cable support assembly of claim 10, wherein the equipment support apparatus is a sliding support assembly.

12. The electrical equipment and cable support assembly of claim 11, wherein in the temporary installation mounting position, the temporary attachment portion is connected to the first cable support member mounting location on the electrical equipment support system, the second cable support member end is connected to the second cable support member mounting location, and the first cable support member end is disconnected from both the first and second cable support member mounting locations.

13. The electrical equipment and cable support assembly of claim 11, wherein in the temporary installation mounting position, the temporary attachment portion of the cable support member is connected to the second cable support member mounting location, the first cable support member end is connected to the first cable support member mounting location, and the second cable support member end is disconnected from both the first and second cable support member mounting locations.

14. The electrical equipment and cable support assembly of claim 10, wherein the cable support member is a flexible belt.

15. The electrical equipment and cable support assembly of claim 10, wherein the cable support member extends curvilinearly between the electrical component supported by the equipment support apparatus and the electrical equipment support system.

16. A method of installing at least one cable on a cable support member, the cable support member having opposite ends and a temporary attachment portion disposed generally intermediate the cable support member ends, the ends of the cable support member being mountable to respective mounting locations in an electrical equipment support system, wherein the method comprises the steps of:

temporarily attaching the temporary attachment portion of the cable support member to one of the mounting locations;

after temporarily attaching the temporary attachment portion, routing at least one cable along the cable support member;

detaching the temporary attachment portion of the cable support member from the mounting location vacated by the temporary attachment portion; and attaching an end of the cable support member to the vacated mounting location.

17. The method of claim 16, further comprising the step of temporarily detaching an end of the cable support member from one of the mounting locations before temporarily attaching the temporary attachment portion of the cable support member, and wherein the step of temporarily attaching includes temporarily attaching the temporary attachment portion of the cable support member to the mounting location vacated by the end of the cable support member.

18. The method of claim 16, wherein the electrical equipment support system includes a first planar surface, and wherein the step of temporarily attaching the temporary attachment portion of the cable support member includes temporarily exposing substantially all of the cable support member from the temporary attachment portion to the temporarily detached cable support member end from underneath the first planar surface.

19. The method of claim 18, wherein the first planar surface is the top surface of a shelf.

20. The method of claim 16, wherein the cable support member is a flexible belt.

21. A method of installing a sliding equipment support assembly in an electrical equipment support system, comprising the steps of:

mounting a pair of mounting bracket assemblies and a pair of slide assemblies having a plurality of inwardly-facing protrusions in the electrical equipment support system;

after the slide assemblies are mounted in the electrical equipment support system, placing a shelf having a plurality of L-slots on the slide assemblies, wherein the placing step includes:
lowering the L-slots onto the protrusions; and
horizontally moving the shelf relative to the slide assemblies until the protrusions reach the ends of the L-slots; and after placing the shelf on the slide assemblies, fastening the shelf to the slide assemblies.

22. The method of claim 21, further comprising the step of attaching a cable management apparatus for supporting cables to the shelf.

23. The method of claim 22, wherein the cable management apparatus is a flexible belt.

24. The method of claim 23, further comprising the steps of:

providing at least one perforation in the flexible belt;
providing at least one retention feature having a plug; and
attaching the retention feature to the flexible belt by inserting the plug through the opening in the flexible belt.

25. The method of claim 22, wherein the step of attaching the cable management apparatus includes attaching the cable management apparatus underneath the shelf.

26. The method of claim 22, wherein the step of attaching the cable management apparatus includes attaching the cable management apparatus between one end of a slide assembly and the electrical equipment support system.

27. A sliding equipment support assembly for supporting at least one electrical component in an electrical equipment support system, the sliding equipment support assembly comprising:

a shelf, the shelf including a top member and at least two side members, each side member having a lower edge penetrated by at least one L-shaped slot; and at least two slide assemblies, each slide assembly including at least an inner slide member and an outer slide member, each inner slide member including at least one protrusion projecting through the L-shaped slot along the lower edge of one of the shelf side members.

28. The sliding equipment support assembly of claim 27, further comprising at least two mounting bracket assemblies, wherein a slide assembly is supported by each mounting bracket.

29. The sliding equipment support assembly of claim 28, wherein each mounting bracket assembly is supported by the electrical equipment support system.

30. The sliding equipment support assembly of claim 27, further comprising a cable management apparatus connected between the sliding equipment support assembly and the electrical equipment support system, for routing at least one cable from an electrical component supported by the shelf to the electrical equipment support system, wherein substantially all of the cable management apparatus extends underneath the shelf when the shelf is retracted within the electrical equipment support system.

31. An electrical equipment and cable support assembly for supporting an electrical component and at least one cable attached thereto in an electrical equipment support system, the electrical equipment support system including at least a first cable support member mounting location, wherein the assembly comprises:
   (a) a shelf assembly mounted in the electrical equipment support system, the shelf assembly having at least a second cable support member mounting location, and the shelf assembly further including:
      (1) a shelf, the shelf including a top member and at least two side members, each side member having a lower edge penetrated by at least one L-shaped slot; and
      (2) at least two slide assemblies, each slide assembly including at least an inner slide member and an outer slide member, each inner slide member including at least one protrusion projecting through the L-shaped slot along the lower edge of one of the shelf side members; and
   (b) a cable management apparatus having a flexible cable support member extending curvilinearly between the shelf assembly and the electrical equipment support system and having at least one retention feature disposed along the length of the cable support member for routing at least one cable from an electrical component supported by the shelf to the electrical equipment support system, the cable support member including first and second ends and a temporary attachment portion disposed generally intermediate the first and second cable support member ends, wherein the cable support member may be mounted in at least two positions including:
      (1) a normal use mounting position, wherein the first end is connected to the first cable support member mounting location and the second end is connected to the second cable support member mounting location; and
      (2) a temporaty installation mounting position, wherein the temporaty attachment portion is connected to one of the cable support member mounting locations.

32. A cable management apparatus for routing at least one cable from a first portion of an electrical equipment support system to a second portion of the electrical equipment support system, wherein the first portion is movable relative to the second portion, the apparatus comprising:
   a flexible support member disposed beneath the first portion of the electrical equipment support system and extending curvilinearly between the first and second portions of the electrical equipment support system, wherein the flexible support member moves in conjunction with the movement of the first portion of the electrical equipment support system, wherein the flexible support member remains connected between the first and second portions of the electrical equipment support system while the first portion moves, and wherein the flexible support member remains disposed generally beneath the first portion of the electrical equipment support system while the first portion moves; and
   at least one retention feature disposed along the flexible support member for supporting at least one cable.

33. The cable management apparatus of claim 32, the electrical equipment support system including a shelf and a stationary structure, wherein the flexible support member is connected between the shelf and the stationary structure of the electrical equipment support system.

34. The cable management apparatus of claim 32, wherein the flexible support member is a belt.

35. The cable management apparatus of claim 32, wherein the portion of the flexible support member extending between the first and second portions is generally uniformly flexible.

36. The cable management apparatus of claim 32, wherein the substantially all of the movement of the flexible support member occurs in a horizontal direction beneath the first portion of the electrical equipment support system.

* * * * *